United States Patent [19]

Cutchaw

[11] 4,381,032

[45] Apr. 26, 1983

[54] APPARATUS FOR COOLING HIGH-DENSITY INTEGRATED CIRCUIT PACKAGES

[76] Inventor: John M. Cutchaw, 7333 E. Virginia Ave., Scottsdale, Ariz. 85257

[21] Appl. No.: 256,841

[22] Filed: Apr. 23, 1981

[51] Int. Cl.³ .................................... F24D 19/02
[52] U.S. Cl. .............................. 165/46; 165/80 C; 165/185; 361/385
[58] Field of Search ............... 165/46, 80 C, 170, 185; 361/385

[56] References Cited

U.S. PATENT DOCUMENTS

| 4,072,188 | 2/1978 | Wilson et al. | 361/385 |
| 4,226,281 | 10/1980 | Chu | 165/185 |
| 4,235,283 | 11/1980 | Gupta | 165/185 |

Primary Examiner—Sheldon J. Richter
Assistant Examiner—John F. McNally
Attorney, Agent, or Firm—Herbert E. Haynes, Jr.

[57] ABSTRACT

An apparatus for cooling a high-density integrated circuit package including a base in which the circuit package is mounted and a heat exchanger which mounts on the base to enclose the circuit package and carry away the heat generated by operation thereof by means of a fluid coolant which is passed through the heat exchanger. The heat exchanger includes a housing having a coolant chamber one surface of which is formed of a pliable thin-wall metallic diaphragm which is biased into heat conductive contact with the circuit package by biasing structures provided in the coolant chamber of the heat exchanger housing.

14 Claims, 5 Drawing Figures

APPARATUS FOR COOLING HIGH-DENSITY INTEGRATED CIRCUIT PACKAGES

BACKGROUND OF THE INVENTION

1. Field of the Invention

This invention relates to cooling mechanisms and more particularly to an apparatus for cooling high-density integrated circuit packages.

2. Description of the Prior Art

In the electronics industry in general, and in the computer arts in particular, one design objective for some time now has been aimed at increasing operating speeds and decreasing unit sizes. One of the major factors which contributed significantly to this design objective is, of course, the integrated circuit chip, or dice as it is sometimes referred to in the industry. Initially, a single dice was mounted in a suitable package, such as a dual-in-line package, and such packages are in common use. However, the trend today is for mounting a plurality of dice in a single package to increase operating speeds by reducing the distances that signals must travel, and also reduce the spaces occupied by the individual dice packaging technique.

Significant gains were made when plural dice were mounted on a two-sided substrate and encapsulated in what is known as a JEDEC packages. In those packages, electrical connections between the plural dice are made within the encapsulating package, and electrical contacts are provided about the package periphery for connection with other components of the overall system. The limiting factor of these JEDEC packaging arrangements is the space available on the opposite sides of the substrate for connecting the dice together.

The most recent development in this field is the use of a multi-layer substrate which significantly increases the space available for internal connections. In particular, one package developed by I.B.M. Corporation has successfully mounted 118 dice on a multi-layer ceramic substrate having 33 layers. This package is 90 MM square and has an array of 361 pins depending from the bottom surface of the multi-layer substrate. The pins are soldered into a circuit board which electrically connects the individual pins to the proper components of the overall system.

While this new dice packaging has achieved the desired increased operating speeds, and reduced the overall size, the ultra-high packaging density has created problems relating to heat dissipation. Cooling by radiation into the atmosphere is completely out of the question, and the use of blowers for moving relatively high velocity air across the packages is inadequate, and liquid cooling systems are being used.

Many of the earlier developed liquid cooling systems, some were developed for use with the JEDEC packages, are inadequate for use with the newly developed multi-layer packaging technology due to insufficient heat transfer between the plural dice and the liquid coolant, and their inability to carry away a sufficient amount of the heat generated by the large numbers of dice.

The cooling system developed by the I.B.M. Corporation for use with the hereinbefore described multi-layer package, includes intricate metal castings, one of which contains the package in a helium filled environment and is provided with 118 bores, each containing a spring loaded piston. Each of these pistons is in contact with a different one of the dice to carry heat away from the dice through the piston, spring, and metal of the casting. Another metal casting is carried atop the piston casting to provide a chilled coolant chamber, which absorbs heat from the lower casting. This cooling apparatus is an exceptionally complex and costly mechanism, occupies a considerable amount of space, and its thermal transfer efficiency is questionable due to the plural heat conductors and interfacing gaps which are encountered by heat migrating from the dice through the pistons, through the springs, through the metal top wall of the lower casting, through the metal lower wall of the top casting and ultimately to the circulating coolant.

Therefore, a need exists for a new and improved apparatus for cooling high-density integrated circuit packages which overcomes some of the problems and shortcomings of the prior art.

SUMMARY OF THE INVENTION

In accordance with the present invention, a new and improved apparatus for cooling high-density integrated circuit packages is disclosed as including a base means for nestingly containing a high-density integrated circuit package which is sealingly enclosed therein by an especially configured heat exchanger, which is demountably carried on the base means.

The heat exchanger includes a rigid metallic housing having a downwardly opening coolant chamber formed therein, which is sized to approximately match that of the high-density integrated circuit package. The downwardly opening coolant chamber is sealingly enclosed by a thin-wall pliant metallic diaphragm or membrane. The pliant metallic membrane rests in thermally conductive contiguous engagement with each of the dice of the high-density integrated circuit package mounted therebelow in the base means. In addition to the pliant metallic membrane resting on the dice, the heat exchanger exerts two additional types of mechanical forces on the metallic membrane to positively bias it into pressurized thermally conductive contact with the dice. The first of these additional mechanical forces may be referred to as hydraulic in that the liquid coolant, which is circulatingly passed through the chamber of the heat exchanger under pressure, will biasingly load the metal diaphragm into contact with the dice. The second mechanical force is provided by a plural biasing means provided in the coolant chamber of the housing. The plural biasing means, which may be in the form of elastomeric elements or spring loaded pistons, are arranged in the coolant chamber of the housing in an array which is the same as the mounting layout of the dice on the multi-layer substrate. Thus, there is one biasing means for each dice so that localized biasing of the pliant metallic membrane is utilized in addition to the general biasing provided by the other above described forces.

The plural biasing means are mounted in the coolant chamber of the heat exchanger by an array of biasing means support walls which depend from the roof wall of the rigid metallic housing and are arranged therein to form a tortuous flow path for the coolant which flows therethrough under pressure between inlet and outlet ports. The coolant is recirculatingly supplied to the heat exchanger from a suitable remote system which forms no part of this invention.

Accordingly, it is an object of the present invention to provide a new and improved apparatus for cooling high-density integrated circuit packages.

Another object of the present invention is to provide a new and improved apparatus for cooling high-density integrated circuit packages which is of minimum complexity, cost and size.

Another object of the present invention is to provide a new and improved apparatus for cooling high-density integrated circuit packages which utilizes a single thermal energy conductor for maximum heat transfer efficiency.

Another object of the present invention is to provide a new and improved apparatus for cooling high-density integrated circuit packages which includes an especially configured heat exchanger which sealingly encloses a high-density integrated circuit package within a base means and carries heat away from the package by means of a coolant which is passed through the heat exchanger.

Another object of the present invention is to provide an apparatus of the above described character wherein the heat exchanger includes a housing having a downwardly opening coolant chamber which is sealingly closed by a thin-wall pliant metal membrane that is in thermally conductive contact with the circulating coolant and with the individual dice of the integrated circuit package.

Another object of the present invention is to provide an apparatus of the above described character wherein the pliant metal membrane rests on each of the dice of the high-density integrated circuit package and is biasingly urged into positive thermally conductive contiguous contact with the individual dice by hydraulic forces derived from the coolant which passes through the heat exchanger and from plural biasing means located in the coolant chamber so as to exert localized forces on the pliant metal membrane in the area where it contacts each of the dice.

Still another object of the present invention is to provide an apparatus of the above described type wherein the plural biasing means are carried in coolant flow directing partitions, or walls, arranged in the coolant chamber of the heat exchanger in a manner which forms a tortuous flow path for the coolant.

The foregoing and other objects of the present invention, as well as the invention itself, may be more fully understood from the following description when read in conjunction with the accompanying drawings.

DESCRIPTION OF THE PREFERRED EMBODIMENTS

Figure 1:
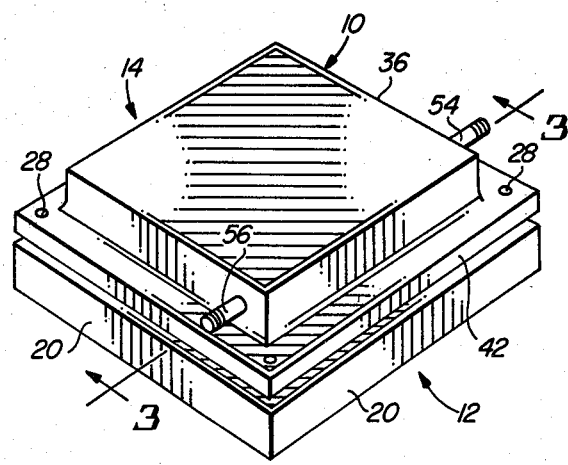
FIG. 1 is a perspective view of the apparatus of the present invention.

Referring more particularly to the drawings, wherein the apparatus for cooling high-density integrated circuit packages is identified in its entirety by the reference numeral 10. As will hereinafter be described in detail, the apparatus 10 includes two basic elements, namely a base means 12 and a heat exchanger 14, which sealingly enclose a high-density integrated circuit package 16 and carry away the heat generated by operation of the circuit package.

The base means 12 is seen to be a substantially planar housing 18 having a floor 19 with an endless upstanding sidewall 20 which defines an upwardly opening chamber 22 for nestingly receiving the circuit package 16. The floor 19 is provided with a plurality of apertures 23 which are arranged in a geometric array which matches the array of conductive pins 24 which depend from the circuit package 16, so that each of the pins 24 passes through a different one of the apertures 23 so as to extend beyond the floor 19 of the base means. A suitable seal 25, such as of glass, is provided in the apertures so that the base means will be a hermetically sealed structure for reasons which will become apparent as this description progresses.

The base means 12 also is provided with an aperture 26 at each of its four corners for containing fastener means 28 by which the heat exchanger 14 is demountably mounted on the base means 12.

The high-density integrated circuit package 16 forms no part of the apparatus of the present invention, but is shown and will now be briefly described for completeness of this disclosure. The package 16 includes a multi-layer substrate 30, usually of ceramic, and the hereinbefore mentioned multiplicity of pins 24 extend from one planar surface of the substrate. The pins 24 provide means for making the necessary electrical interconnections between the integrated circuit package 16 and other components of the system (not shown) in which the package is to be used. Further, in accordance with customary practices, the pins 24 are also used to mount the package on a circuit board (not shown) by soldering the pins in holes provided on the circuit board. The opposite planar surface 31 of the multi-layer substrate 30 has a plurality of discrete integrate circuits 32, or dice, mounted thereon in a predetermined geometric array which usually consists of a plurality of equally spaced rows and columns.

Figure 3:
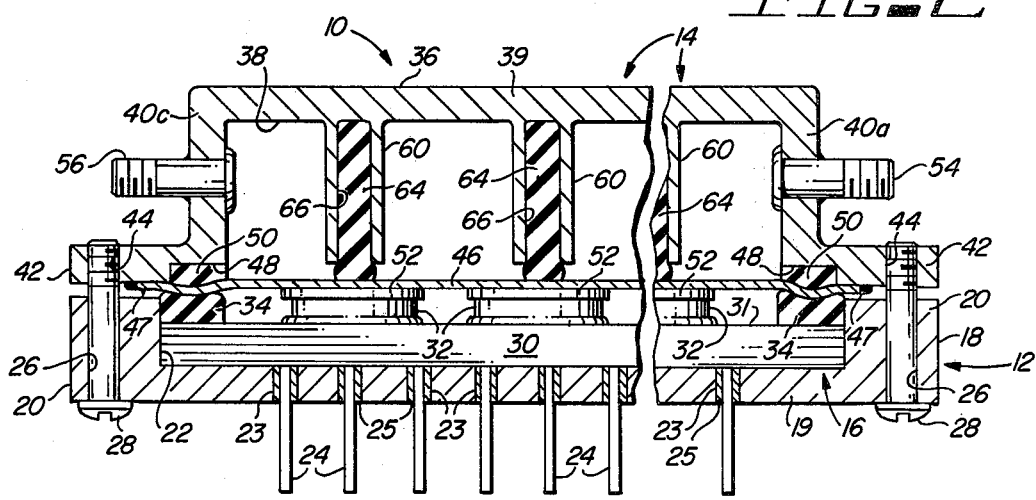
FIG. 3 is an enlarged fragmentary sectional view taken along the line 3—3 of FIG. 1.

As seen in FIG. 3, the upwardly opening chamber 22 of the base means 12 is deeper than the thickness dimension of the substrate 30 and an endless elastomeric seal 34 of square sided ring-like shape is restingly placed on the substrate so as to be in bearing engagement with the planar surface 31 thereof adjacent the peripheral edge of the substrate. The endless seal 34 is used to sealingly encase the integrated circuit package 16 in the apparatus 10 as will hereinafter be described in detail.

The heat exchanger 14 includes a housing 36 of relatively thick-wall metallic material which is configured to define a downwardly opening chamber 38 which will hereinafter be referred to as the coolant chamber for reasons which will soon become apparent. The housing 36 includes a roof wall 39 with an integrally depending endless sidewall formed of sidewall segments 40a, 40b, 40c and 40d, which cooperatively define the coolant chamber 38. An endless flange 42 extends normally from the sidewall with internally threaded bores 44 at each corner thereof. These threaded bores 44 align with the fastener means 28 carried in the corner apertures 26 of the base means 12 and serve as means by which the heat exchanger 14 is demountably attached to the base means.

The coolant chamber 38 of the heat exchanger 14 is sealingly closed by a pliable thin-wall diaphragm 46, or membrane, which is preferably formed of a metal having good heat transfer properties such as copper. The peripheral edge of the diaphragm 46 partially overlays the endless flange 42 of the housing 36 and is fixedly attached thereto such as by soldering, or welding, or the like, and is indicated as at 47 in FIG. 3. An endless groove 48 is formed in the flange 42 so as to be disposed adjacent the peripheral edge of the thin-wall diaphragm 46 and an elastomeric shim 50 is mounted in the groove. The shim 50 is sized so that it yieldingly biases the metal thin-wall diaphragm 46 in the direction away from the coolant chamber 38. In other words, the elastomeric shim 50 has a thickness dimension which is greater than the depth of the groove 48 so that it protrudes beyond the endless flange 42. As seen in FIG. 3, the elastomeric seal 50 is sized and disposed in the housing 36 so that it aligns with the endless seal 34 which rests atop the integrated circuit package 16 so that when the heat exchanger 14 is mounted on the base means, the peripheral edge of the metallic thin-wall diaphragm 46 will be in sealing engagement with the seal 34, thus, providing sealed enclosing of the integrated circuit package 16. In addition to this sealing function, the elastomeric shim 50 provides means for increasing the flexibility of the diaphragm adjacent its attached peripheral edges.

As hereinbefore mentioned, the integrated circuit package 16 is provided with the plurality of discrete dice 32 arranged in a predetermined geometric array thereon. The pliant thin-wall metallic diaphragm 46 is biased, as will hereinafter be described in detail, into thermally conductive contact with those dice to carry away the heat generated thereby. To insure that a positive contiguous contact exists, the metal diaphragm 46 is preferably provided with plural disks 52 at each location which is in engagement with the dice 32. Thus, in the preferred embodiment, the metal diaphragm 46 is provided with a plurality of thermally conductive disks 52, such as of copper, which are soldered or otherwise attached thereto in a geometric array which matches that of the dice layout on the ceramic substrate 30.

The coolant chamber 38 of the heat exchanger 14 is provided with a fluid coolant inlet fitting 54 in the sidewall segment 40a of the housing 36, and a fluid coolant outlet fitting 56 is mounted in the opposed sidewall segment 40c. A fluid coolant (not shown) is passed through the coolant chamber 38 under pressure with the coolant being supplied by a suitable remote system (not shown) which forms no part of the present invention.

Figure 2:
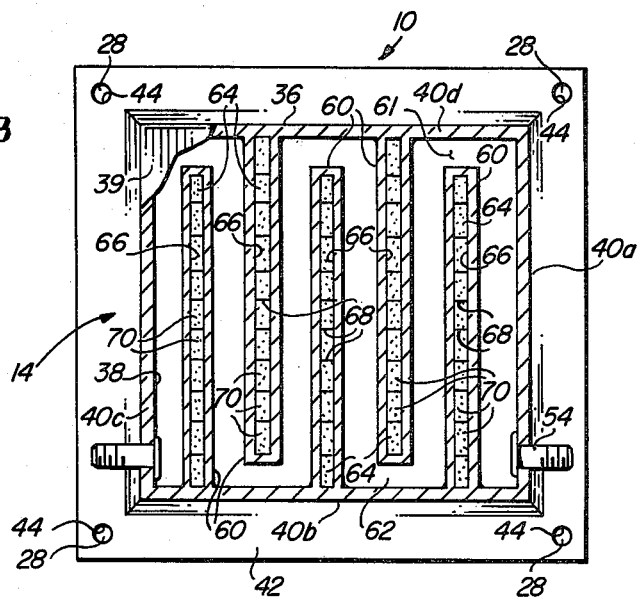
FIG. 2 is an enlarged plan view of the apparatus which is partially broken away to show the various features thereof.

The housing 36 of the heat exchanger 14 is provided with a plurality of walls 60, or partitions, all of which integrally depend from the roof 39 into the coolant chamber 38. As seen in FIG. 2, the depending partitions 60 are alternately connected to opposed sidewall segments 40b and 40d of the housing 36. In other words, a first one of the partitions 60 extends integrally and normally from the sidewall segment 40b toward the opposite sidewall segment 40d, but stops short of that opposite sidewall segment 40d to provide a coolant flow passage 61 around the end of that first partition. The next partition 60 extends integrally and normally from the opposite sidewall segment 40d and stops just short of the sidewall segment 40b to provide a similar coolant flow passage 62 around that partition. In this manner, the partitions provide a tortous flow path for the coolant to prevent localized hot spots which could otherwise occur as a result of channelization and the like.

In addition to the flow directing capabilities of the depending partitions 60, they provide means for supporting biasing means which in this embodiment of the present invention are in the form of elastomeric strips 64. The partitions 60 are disposed so that each of the partitions is in alignment with a different row of the dice 32 of the integrated circuit package 16, and each of the partitions 60 are formed with a downwardly opening channel 66 in which one of the elastomeric strips 64 is carried. The elastomeric strips depend from their respective partitions 60 into bearing engagement with the inner surface of the pliable thin-wall metal diaphragm 46 and thus will bias the diaphragm into engagement with the dice 32. As seen in FIG. 2, the elastomeric strips 64 are preferably cut as at 68, at predetermined intervals, so that each strip is formed of a plurality of strip segments 70. The cuts are spaced so that each segment is aligned with a different one of the dice 32 with this allowing each strip segment 70 to individually apply its biasing force and thus negate the adverse affects which could otherwise result from tolerance build-ups. By way of explanation, if one of the dice 32 is somewhat thicker than the dice immediately adjacent thereto, it could deflect the metal diaphragm 46 to the extent where it is moved away from the adjacent dice. This problem could become serious if, for example, one of the adjacent dice is smaller than normal and/or the disk 52 thereof is smaller than normal.

From the above, it will be seen that three separate forces cooperate to bias the metal diaphragm into conductive contiguous contact with the dice 32 of the integrated circuit package 16. The first of these forces is applied when the heat exchanger 14 is mounted on the base means 12 so as to bring the diaphragm 46, i.e. its integral disks 52, into bearing engagement with the dice 32 of the integrated circuit package 16. The second force is derived from the fluid pressure of the coolant which passes through the coolant chamber 38 under pressure. The pressure of the coolant will be applied to the pliant metal diaphragm 46. And the third force, which is the most positive of the three, is derived from the elastomeric strips 64 in the manner described above.

Figure 4:
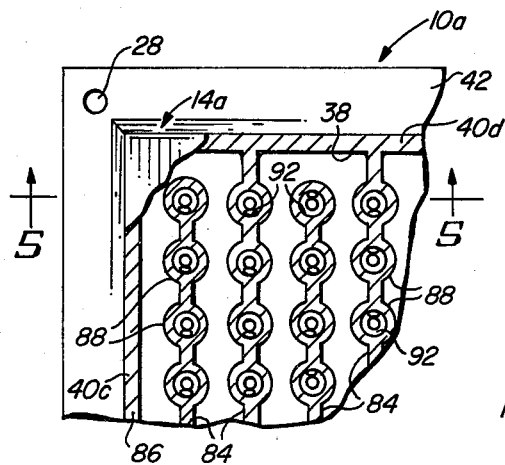
FIG. 4 is a fragmentary plan view partially broken away to show the various features of a modified form of the apparatus of the present invention.
Figure 5:
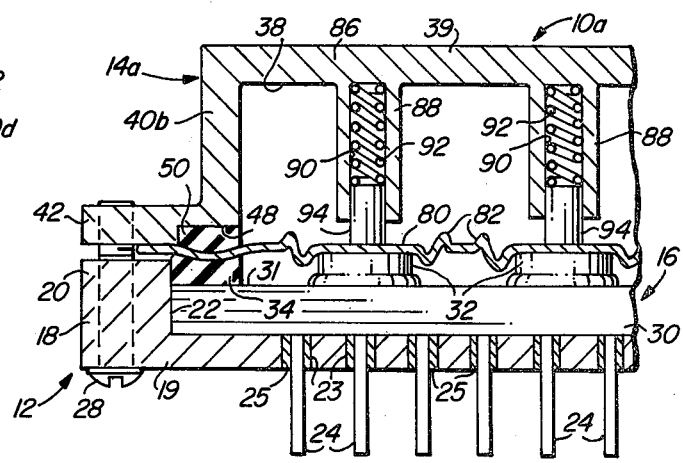
FIG. 5 is an enlarged fragmentary sectional view taken along the line 5—5 of FIG. 4.

Referring now to FIGS. 4 and 5 wherein a modified form of the apparatus of the present invention is shown, with this modified embodiment being indicated in its entirety by the reference numeral 10a. In order to prevent repeating of structural details which already have been described in detail, it will be understood that the apparatus 10a is the same as the hereinbefore described apparatus 10 with the exception of those portions which will now be described in detail.

The heat exchanger 14a of this embodiment includes a pliant thin-wall metallic diaphragm 80 which is formed with concentric convolutions 82 at each location thereof which is in bearing engagement with the dice 32 of the integrated circuit package 16. These convolutions 82, which accomplish the same objective as the metal disks 52 of the previously described metal diaphragm 46, increase diaphragm flexibility in the individual areas of bearing engagement.

As seen best in FIG. 4, the depending partitions 84 of the heat exchanger housing 86 are cast or otherwise provided with a plurality of cylindrical bosses 88 with there being one boss in vertical alignment with each of the dice 32 of the integrated circuit package 16. A blind bore 90 is formed to extend upwardly in each of the bosses 88, and a compression spring 92 and a piston 94 are carried in each of those bores 90. The pistons 94 are biased by their respective compression springs 92 into bearing engagement with the inner surface of the metal diaphragm and thus exert localized forces thereon which form positive thermally conductive contiguous contact with the dice 32 of the integrated circuit package 16.

While the principles of the invention have now been made clear in illustrated embodiments, there will be immediately obvious to those skilled in the art, many modifications of structure, arrangements, proportions, the elements, materials and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. An apparatus for cooling a high-density integrated circuit package of the type having a substrate with a plurality of discrete integrated circuits arranged thereon in a predetermined geometric array, said apparatus comprising:
   (a) a housing defining an open coolant chamber which is sized so that its opening substantially matches the surface area of the substrate of the integrated circuit package, said housing for positioning in overlaying relationship with respect to the integrated circuit package;
   (b) a diaphragm of thin-wall pliable heat conductive material with its peripheral edges fixedly attached to said housing so as to sealingly enclose the coolant chamber thereof, said diaphragm being in contiguous engagement with each of the discrete integrated circuits of the integrated circuit package when said housing is in overlaying relationship therewith;
   (c) said housing having an inlet port and an outlet port by which fluid coolant is passable through the coolant chamber of said housing;
   (d) partition means fixed in the coolant chamber of said housing for presenting a tortuous flow path for the fluid coolant which is passable therethrough; and
   (e) biasing means mounted on said partition means within the coolant chamber of said housing for applying biasing forces on said diaphragm at each location thereof which is in contiguous engagement with the discrete integrated circuits of the integrated circuit package when said housing is in overlaying relationship therewith.

2. An apparatus as claimed in claim 1 and further comprising:
   (a) base means defining an open chamber for nestingly receiving the integrated circuit package; and
   (b) cooperative elements of a demountable connection on said base and on said housing for attaching said housing to said base in overlaying relationship with the integrated circuit package when it is nestingly received in said base means.

3. An apparatus as claimed in claim 2 and further comprising:
   (a) said open chamber of said base means being deeper than the thickness dimension of the substrate of the integrated circuit package; and
   (b) an endless ring-shaped elastomeric seal for placement on the substrate of the integrated circuit package adjacent its periphery, said elastomeric seal being sized so that when it is on the substrate of the integrated circuit package and the integrated circuit package is in the open chamber of said base means, said elastomeric seal will protrude from the open chamber of said base means.

4. An apparatus as claimed in claim 1 and further comprising an endless elastomeric shim mounted on said housing so as to surround and protrude beyond the opening of the coolant chamber of said housing for exerting a yieldable biasing force on said diaphragm adjacent its fixed peripheral edges.

5. An apparatus as claimed in claim 1 wherein said diaphragm is formed of metal with a metallic disk at each location thereof which is in contiguous engagement with the discrete integrated circuits of the integrated circuit package when said housing is in overlaying relationship therewith.

6. An apparatus as claimed in claim 1 wherein said diaphragm is formed of metal and has concentric convolutions formed therein at each location thereof which is in contiguous engagement with the discrete integrated circuits of the integrated circuit package when said housing is in overlaying relationship therewith.

7. An apparatus as claimed in claim 1 wherein said biasing means comprises an elastomeric element in biasing engagement with the inner surface of said diaphragm at each location of said diaphragm which is biased into contiguous engagement with the discrete integrated circuits of the integrated circuit package when said housing is in overlaying relationship therewith.

8. An apparatus as claimed in claim 1 wherein said biasing means comprises a spring-loaded piston in bearing engagement with the inner surface of said diaphragm at each location of said diaphragm which is biased into contiguous engagement with the discrete integrated circuits of the integrated circuit package when said housing is in overlaying relationship therewith.

9. An apparatus as claimed in claim 1 wherein said housing comprises:
   (a) a roof wall of substantially planar configuration; and
   (b) an endless sidewall extending normally from the periphery of said roof wall.

10. An apparatus as claimed in claim 9 wherein said partition means comprises a plurality of spacedly arranged walls which extend from said roof wall into the coolant chamber of said housing so as to be in spaced proximity with said diaphragm, said plurality of walls extending alternately from opposed portions of said endless sidewall laterally into the coolant chamber and each having its laterally extending end spaced from said endless sidewall.

11. An apparatus as claimed in claim 10 and further comprising:
   (a) said plurality of walls each having an elongated channel formed therein; and
   (b) an elongated elastomeric strip mounted in the channel of each of said plurality of walls to provide said biasing means.

12. An apparatus as claimed in claim 11 wherein said elongated elastomeric strip is cut at predetermined intervals along its length to provide a plurality of individually acting biasing segments.

13. An apparatus as claimed in claim 10 wherein each of said plurality of walls is provided with a plurality of blind bores formed therein at predetermined spaced intervals, each of said blind bores extending toward said roof wall and each containing a different one of said biasing means.

14. An apparatus as claimed in claim 13 wherein each of said biasing means comprises:

(a) a piston slidably mounted in one of said blind bores formed in the one of said plurality of walls and extending therefrom into engagement with the inner surface of said diaphragm; and (b) a compression spring in the one of said blind bores and in engagement with said piston for biasingly urging it into engagement with the inner surface of said diaphragm.

* * * * *